US009780220B2

(12) United States Patent
Maeda et al.

(10) Patent No.: US 9,780,220 B2
(45) Date of Patent: Oct. 3, 2017

(54) SEMICONDUCTOR DEVICE AND METHOD FOR MANUFACTURING SAME

(71) Applicant: Kabushiki Kaisha Toshiba, Minato-ku (JP)

(72) Inventors: Yuya Maeda, Kawasaki (JP); Shintaro Nakano, Kawasaki (JP); Nobuyoshi Saito, Ota (JP); Hajime Yamaguchi, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/251,521

(22) Filed: Aug. 30, 2016

(65) Prior Publication Data

US 2016/0372604 A1 Dec. 22, 2016

Related U.S. Application Data

(63) Continuation of application No. PCT/JP2015/052237, filed on Jan. 27, 2015.

(30) Foreign Application Priority Data

Mar. 31, 2014 (JP) ................................ 2014-072549

(51) Int. Cl.
*H01L 29/12* (2006.01)
*H01L 29/786* (2006.01)
(Continued)

(52) U.S. Cl.
CPC ........ *H01L 29/78618* (2013.01); *H01L 29/24* (2013.01); *H01L 29/45* (2013.01);
(Continued)

(58) Field of Classification Search
CPC ........................ H01L 29/78618; H01L 29/201
See application file for complete search history.

(56) References Cited

U.S. PATENT DOCUMENTS

2010/0148171 A1 6/2010 Hayashi et al.
2011/0309353 A1 12/2011 Kaneko et al.
(Continued)

FOREIGN PATENT DOCUMENTS

JP 2005-123576 5/2005
JP 2010-141230 A 6/2010
(Continued)

OTHER PUBLICATIONS

Written Opinion dated Apr. 21, 2015 in PCT/JP2015/052237 (submitting English language translation only).
(Continued)

*Primary Examiner* — Samuel Gebremariam
(74) *Attorney, Agent, or Firm* — Oblon, McClelland, Maier & Neustadt, L.L.P.

(57) ABSTRACT

According to one embodiment, a semiconductor device includes an oxide semiconductor transistor. The oxide semiconductor transistor includes a semiconductor layer including an oxide semiconductor, the semiconductor layer including a source region and a source electrode. The source electrode includes a source conductive layer including copper, a first tantalum-containing region provided between the source conductive layer and the source region, the first tantalum-containing region including tantalum, a first low nitrogen composition region provided between the first tantalum-containing region and the source region, the first low nitrogen composition region including $Ta_{1-x1}N_{x1}$ ($0<x1<0.5$), and a first high nitrogen composition region provided between the first low nitrogen composition region and the source region, the first high nitrogen composition region including $Ta_{1-x2}N_{x2}$ ($0.5\leq x2<1$).

18 Claims, 6 Drawing Sheets

110 70 20 20c 20t 20l 20h 30g 10c 10t 10l 10h 10 84i 30d 30 30s 40 42 41 50c 50 83i 50b Z Y X 10c 10t 10 10l 10h 30s(30)

(51) Int. Cl.

| | |
|---|---|
| ***H01L 29/45*** | (2006.01) |
| ***H01L 29/24*** | (2006.01) |
| ***H01L 29/49*** | (2006.01) |
| ***H01L 29/51*** | (2006.01) |
| ***H01L 29/66*** | (2006.01) |
| *H01L 21/8258* | (2006.01) |
| *H01L 27/06* | (2006.01) |

(52) U.S. Cl.

CPC ........ *H01L 29/4908* (2013.01); *H01L 29/512* (2013.01); *H01L 29/66969* (2013.01); *H01L 29/7869* (2013.01); *H01L 21/8258* (2013.01); *H01L 27/0688* (2013.01)

(56) References Cited

U.S. PATENT DOCUMENTS

| | | | |
|---|---|---|---|
| 2012/0298986 | A1 | 11/2012 | Inoue et al. |
| 2013/0037795 | A1 | 2/2013 | Sunamura et al. |
| 2013/0207111 | A1 | 8/2013 | Yamazaki |
| 2014/0021466 | A1 | 1/2014 | Yamazaki et al. |
| 2014/0145184 | A1 | 5/2014 | Amano |

FOREIGN PATENT DOCUMENTS

| | | | |
|---|---|---|---|
| JP | 2011-187898 | | 9/2011 |
| JP | 2012-28731 | A | 2/2012 |
| JP | 2012-248582 | | 12/2012 |
| JP | 2013-38349 | | 2/2013 |
| JP | 2013-179290 | A | 9/2013 |
| JP | 2014-22492 | A | 2/2014 |
| JP | 2015-149414 | A | 8/2015 |
| WO | WO 2013/008403 | A1 | 1/2013 |

OTHER PUBLICATIONS

International Search Report dated Apr. 21, 2015 in PCT/JP2015/052237, filed on Jan. 27, 2015 ( with English translation).

Written Opinion dated Apr. 21, 2015 in PCT/JP2015/052237, filed on Jan. 27, 2015.

SEMICONDUCTOR DEVICE AND METHOD FOR MANUFACTURING SAME

CROSS-REFERENCE TO RELATED APPLICATIONS

This is a continuation application of International Application PCT/JP2015/052237, filed on Jan. 27, 2015; the entire contents of which are incorporated herein by reference.

FIELD

Embodiments described herein relate generally to a semiconductor device and a method for manufacturing the same.

BACKGROUND

A semiconductor device that uses an oxide semiconductor transistor has been proposed. It is desirable to obtain stable characteristics.

DETAILED DESCRIPTION

Figure 1A:
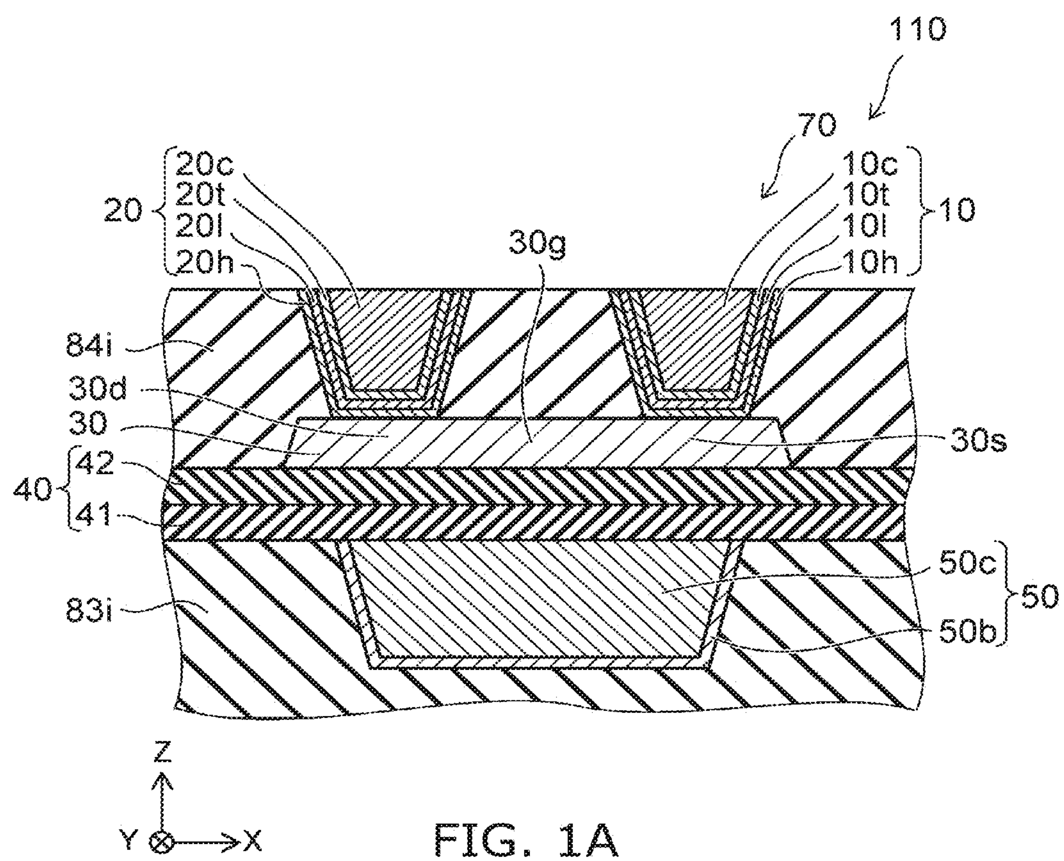
FIG. 1A and FIG. 1B are schematic cross-sectional views illustrating a semiconductor device according to a first embodiment.

According to one embodiment, a semiconductor device includes an oxide semiconductor transistor. The oxide semiconductor transistor includes a semiconductor layer including an oxide semiconductor, the semiconductor layer including a source region and a source electrode. The source electrode includes a source conductive layer including copper, a first tantalum-containing region provided between the source conductive layer and the source region, the first tantalum-containing region including tantalum, a first low nitrogen composition region provided between the first tantalum-containing region and the source region, the first low nitrogen composition region including $Ta_{1-x1}N_{x1}$ ($0<x1<0.5$), and a first high nitrogen composition region provided between the first low nitrogen composition region and the source region, the first high nitrogen composition region including $Ta_{1-x2}N_{x2}$ ($0.5 \leq x2<1$).

According to another embodiment, a method for manufacturing a semiconductor device is provided. The device includes an oxide semiconductor transistor including a source electrode. The method an include forming a first high nitrogen composition region on a portion of a semiconductor layer including an oxide semiconductor, the first high nitrogen composition region including $Ta_{1-x2}N_{x2}$ ($0.5 \leq x2<1$). The method can include forming a first low nitrogen composition region on the first high nitrogen composition region, the first low nitrogen composition region including $Ta_{1-x1}N_{x1}$ ($0<x1<0.5$). The method can include forming a first tantalum-containing region on the first low nitrogen composition region, the first tantalum-containing region including tantalum. In addition, the method can include forming a source conductive layer on the first tantalum-containing region, the source conductive layer including copper. The source electrode includes the first high nitrogen composition region, the first low nitrogen composition region, the first tantalum-containing region, and the source conductive layer.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1B:
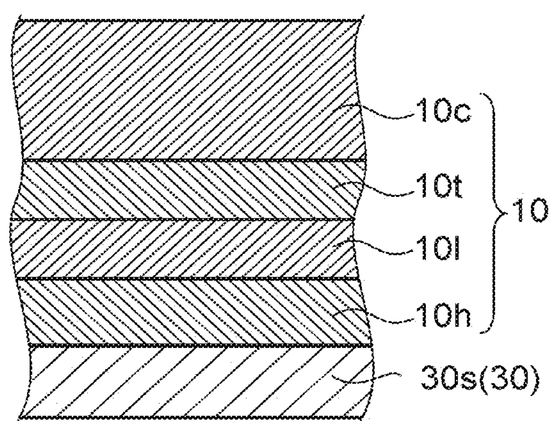

FIG. 1A and FIG. 1B are schematic cross-sectional views illustrating a semiconductor device according to a first embodiment.

FIG. 1B illustrates a portion of FIG. 1A.

As shown in FIG. 1A, the semiconductor device 110 according to the embodiment includes an oxide semiconductor transistor 70. The oxide semiconductor transistor 70 includes a semiconductor layer 30, a source electrode 10, a drain electrode 20, and a gate electrode 50.

A direction from the semiconductor layer 30 toward the source electrode 10 is taken as a Z-axis direction. One direction perpendicular to the Z-axis direction is taken as an X-axis direction. A direction perpendicular to the Z-axis direction and the X-axis direction is taken as a Y-axis direction.

The semiconductor layer 30 includes a source region 30*s*, a drain region 30*d*, and a gate region 30*g*. The gate region 30*g* is disposed between the source region 30*s* and the drain region 30*d*. These regions are disposed in a plane (in the X-Y plane) perpendicular to the direction from the semiconductor layer 30 toward the source electrode 10.

The semiconductor layer 30 includes an oxide of at least one of In, Ga, or Zn. The semiconductor layer 30 includes, for example, InGaZnO. The semiconductor layer 30 may include, for example, ITO (InSnO). The semiconductor layer 30 may include ZnO. The semiconductor layer 30 may include InGaO. The semiconductor layer 30 may include InZnO. The semiconductor layer 30 may include ZnSnO. The semiconductor layer 30 may include InSnZnO.

The source electrode 10 is connected to the source region 30*s*. The drain electrode 20 is connected to the drain region 30*d*.

As shown in FIG. 1A and FIG. 1B, the source electrode 10 includes a source conductive layer 10*c*, a first tantalum-containing region 10*t*, a first low nitrogen composition region 10*l*, and a first high nitrogen composition region 10*h*. The source conductive layer 10*c* includes copper. The source conductive layer 10*c* is, for example, a copper layer.

The first tantalum-containing region 10*t* is provided between the source conductive layer 10*c* and the source region 30*s*. The first tantalum-containing region 10*t* includes tantalum. The first tantalum-containing region 10*t* is, for example, a tantalum layer.

The first low nitrogen composition region 10*l* is provided between the first tantalum-containing region 10*t* and the source region 30*s*. The first low nitrogen composition region 10*l* includes $Ta_{1-x1}N_{x1}$ ($0<x1<0.5$).

The first high nitrogen composition region 10*h* is provided between the first low nitrogen composition region 10*l* and the source region 30*s*. The first high nitrogen composition region 10*h* includes $Ta_{1-x2}N_{x2}$ ($0.5 \leq x2<1$). The composition ratio of nitrogen in the first high nitrogen composition region 10*h* is higher than the composition ratio of nitrogen in the first low nitrogen composition region 10*l*.

As shown in FIG. 1A, the drain electrode 20 includes a drain conductive layer 20*c*, a second tantalum-containing region 20*t*, a second low nitrogen composition region 20*l*, and a second high nitrogen composition region 20*h*. The drain conductive layer 20*c* includes copper. The drain conductive layer 20*c* is, for example, a copper layer.

The second tantalum-containing region 20*t* is provided between the drain conductive layer 20*c* and the drain region 30*d*. The second tantalum-containing region 20*t* includes tantalum. The second tantalum-containing region 20*t* is, for example, a tantalum layer.

The second low nitrogen composition region 20*l* is provided between the second tantalum-containing region 20*t* and the drain region 30*d*. The second low nitrogen composition region 20*l* includes $Ta_{1-x3}N_{x3}$ ($0<x3<0.5$). The second high nitrogen composition region 20*h* is provided between the second low nitrogen composition region 20*l* and the drain region 30*d*. The second high nitrogen composition region 20*h* includes $Ta_{1-x4}N_{x4}$ ($0.5 \leq x4<1$). The composition ratio of nitrogen in the second high nitrogen composition region 20*h* is higher than the composition ratio of nitrogen in the second low nitrogen composition region 20*l*.

For example, the composition ratio x3 is the same as the composition ratio x1. The composition ratio x3 may be different from the composition ratio x1. For example, the composition ratio x4 is the same as the composition ratio x2. The composition ratio x4 may be different from the composition ratio x2.

In the example, the interface between the first high nitrogen composition region 10*h* and the first low nitrogen composition region 10*l* is parallel to the interface between the second high nitrogen composition region 20*h* and the second low nitrogen composition region 20*l*.

A gate insulating layer 40 is provided between the semiconductor layer 30 and the gate electrode 50. In the example, the gate insulating layer 40 includes a first gate insulating film 41 and a second gate insulating film 42. The second gate insulating film 42 is disposed between the first gate insulating film 41 and the semiconductor layer 30. For example, the first gate insulating film 41 includes SiN. For example, the second gate insulating film 42 includes $SiO_2$.

In the example, the semiconductor layer 30 is provided between the gate electrode 50 and the source electrode 10 and between the gate electrode 50 and the drain electrode 20. When projected onto the X-Y plane, the gate electrode 50 overlaps the gate region 30*g*.

In the example, the gate electrode 50 includes a copper layer 50*c* and a barrier layer 50*b*. The copper layer 50*c* is disposed between the barrier layer 50*b* and the gate insulating layer 40.

Figure 2:
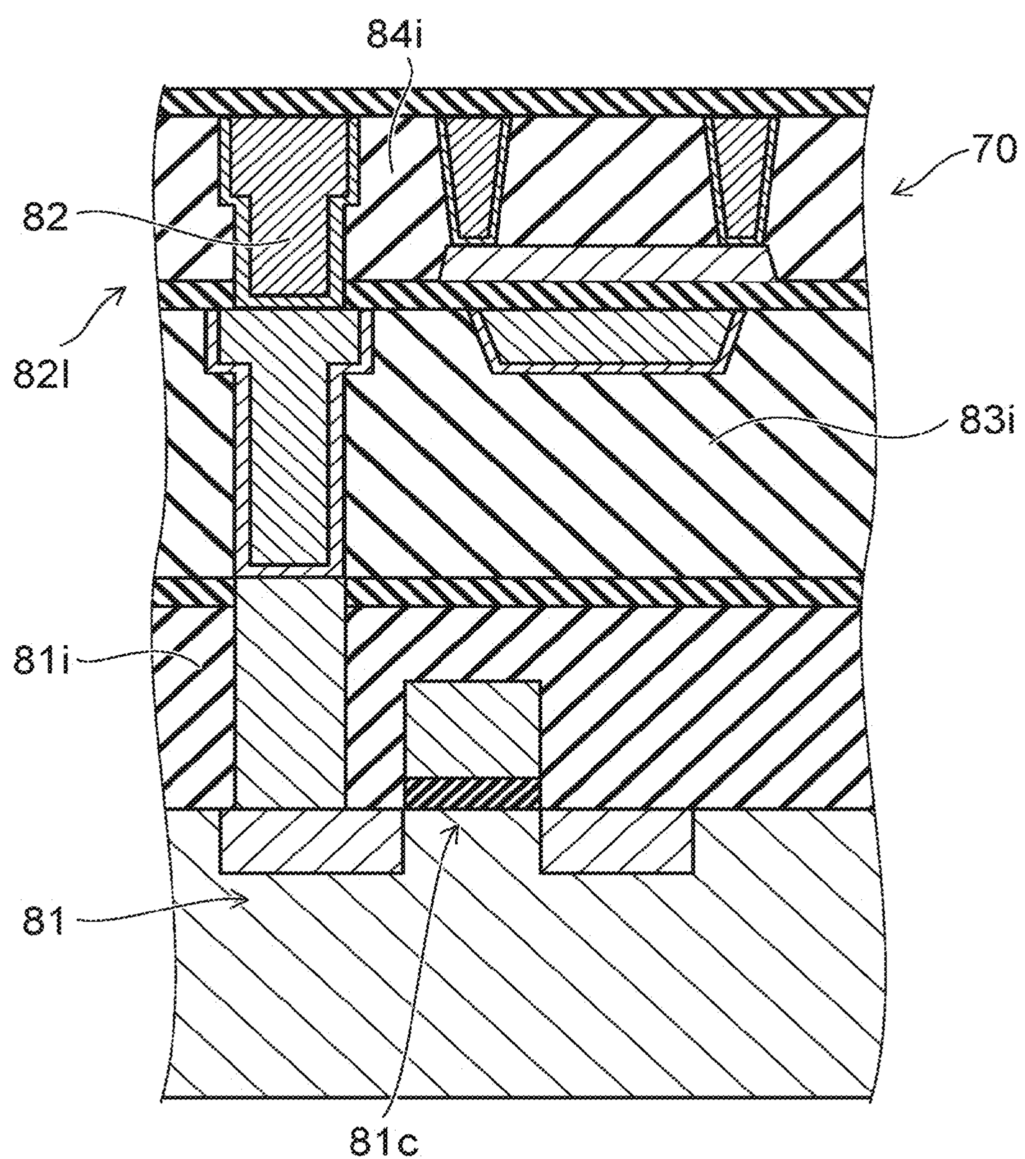
FIG. 2 is a schematic cross-sectional view illustrating the semiconductor device according to the first embodiment.

FIG. 2 is a schematic cross-sectional view illustrating the semiconductor device according to the first embodiment.

In the semiconductor device 110 according to the embodiment as shown in FIG. 2, the oxide semiconductor transistor 70 is provided on a circuit layer 81.

In other words, the semiconductor device 110 includes the circuit layer 81 that includes a semiconductor circuit 81*c*. For example, an insulating layer 81*i* is provided on the circuit layer 81; and an insulating layer 83*i* is provided on the insulating layer 81*i*. The oxide semiconductor transistor 70 is provided on the insulating layer 83*i*. An insulating layer 84*i* is provided on the oxide semiconductor transistor 70 and the insulating layer 83*i*. Thus, the oxide semiconductor transistor 70 is provided on the circuit layer 81.

An interconnect layer 82*l* is provided on the circuit layer 81. The oxide semiconductor transistor 70 is provided at the height of the interconnect layer 82*l*. For example, an interconnect 82 is provided in the interconnect layer 82*l*. The interconnect 82 is electrically connected to the semiconductor circuit 81*c*. The interconnect 82 is, for example, a via electrode (a via contact). The interconnect 82 includes copper. Thereby, a low resistance is obtained.

A direction (e.g., a direction along the X-axis direction) connecting the interconnect 82 and the oxide semiconductor transistor 70 intersects a direction (e.g., a direction along the Z-axis direction) connecting the circuit layer 81 and the oxide semiconductor transistor 70.

In the embodiment, for example, the oxide semiconductor transistor 70 is electrically connected to at least a portion of the semiconductor circuit 81*c*. The connection may include at least a portion of the interconnect 82.

Thus, in the embodiment, the oxide semiconductor transistor 70 is provided at the position of the interconnect layer 82*l* provided on the circuit layer 81. In such a configuration as described below, the characteristics of the oxide semiconductor transistor 70 change easily. In the embodiment, the first low nitrogen composition region 10*l* and the first high nitrogen composition region 10*h* are provided in the source electrode 10. The second low nitrogen composition region 20*l* and the second high nitrogen composition region 20*h* are provided in the drain electrode 20. Thereby, stable characteristics are obtained.

For example, heat treatment may be performed in the case where a copper interconnect is used as the interconnect 82. For example, a temperature of about 400° C. is used in the heat treatment. The atmosphere of the heat treatment is, for example, a hydrogen atmosphere. Or, the atmosphere of the heat treatment is, for example, an atmosphere of a gas mixture (a forming gas) of hydrogen and nitrogen. The heat treatment can reduce plasma damage or defects of the thin film transistor, the interconnect layer, or the circuit layer occurring in the processes prior to the heat treatment.

It was found that the characteristics of the oxide semiconductor transistor 70 fluctuate easily due to the heat treatment in the case where the oxide semiconductor transistor 70 is formed inside the interconnect layer 82*l*.

In the embodiment as recited above, stable characteristics are obtained by using the stacked structure including the low nitrogen composition region and the high nitrogen composition region.

Examples of the characteristics of the oxide semiconductor will now be described.

Figure 3A:
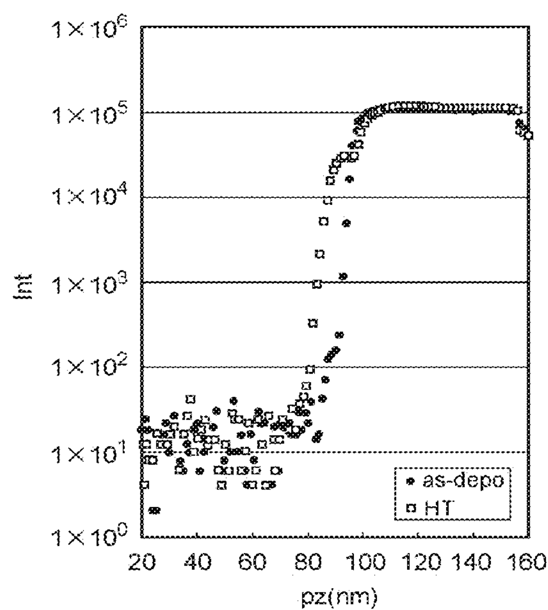
FIG. 3A to FIG. 3C are graphs of characteristics of the oxide semiconductor transistor.
Figure 3B:
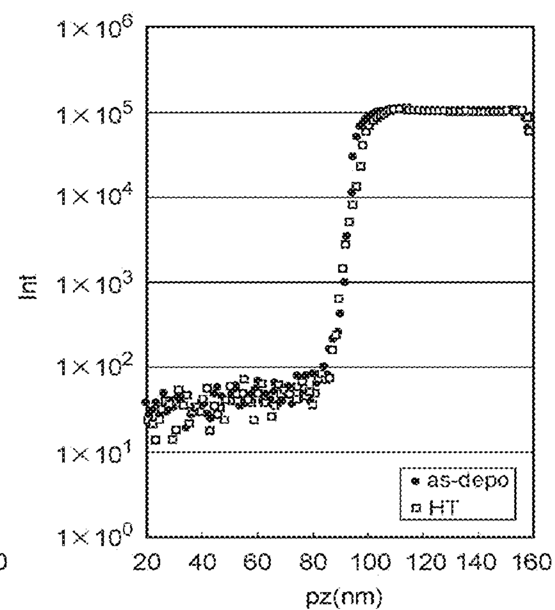
Figure 3C:
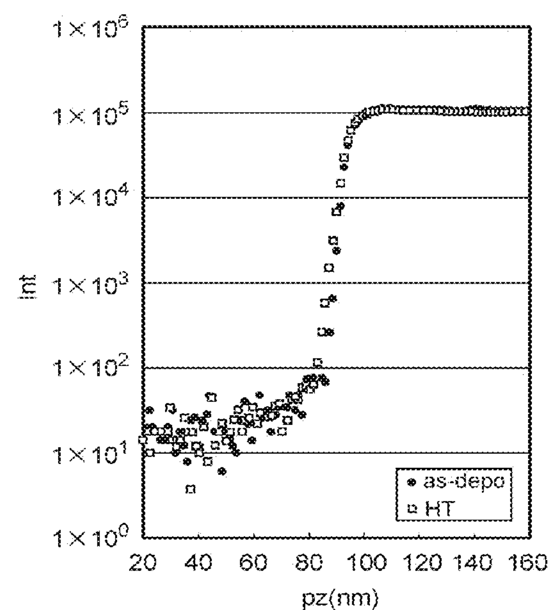

FIG. 3A to FIG. 3C are graphs of characteristics of the oxide semiconductor transistor.

These figures illustrate the results of secondary ion mass spectrometry (SIMS) of samples in which a $Ta_{1-x}N_x$ layer is provided on an InGaZnO layer (the semiconductor layer 30).

The horizontal axis is a position pz in the direction from the $Ta_{1-x}N_x$ layer toward the InGaZnO layer. The vertical axis is a secondary ion intensity Int. In the example, the results are shown for a sample HT for which the heat treatment is performed, and a sample (as depo) for which the heat treatment is not performed. The temperature of the heat treatment is about 400° C. In FIG. 3A, the nitrogen composition of the $Ta_{1-x}N_x$ layer (the composition ratio x of nitrogen) is about 0.49. In FIG. 3B, the composition ratio x is about 0.55. In FIG. 3C, the composition ratio x is about 0.59.

It can be seen from FIG. 3A that when the composition ratio x is low and is about 0.49, the characteristics of the sample HT for which the heat treatment is performed are greatly different from the characteristics of the sample (as depo) for which the heat treatment is not performed.

As shown in FIG. 3B and FIG. 3C, when the composition ratio x is high and is about 0.55 or about 0.59, the characteristics of the sample HT for which the heat treatment is performed substantially match those of the sample (as depo) for which the heat treatment is not performed.

FIG. 4A to FIG. 4E are electron microscope photographs illustrating characteristics of the oxide semiconductor transistor.

Figures 4A, 4B, 4C, 4D, 4E:
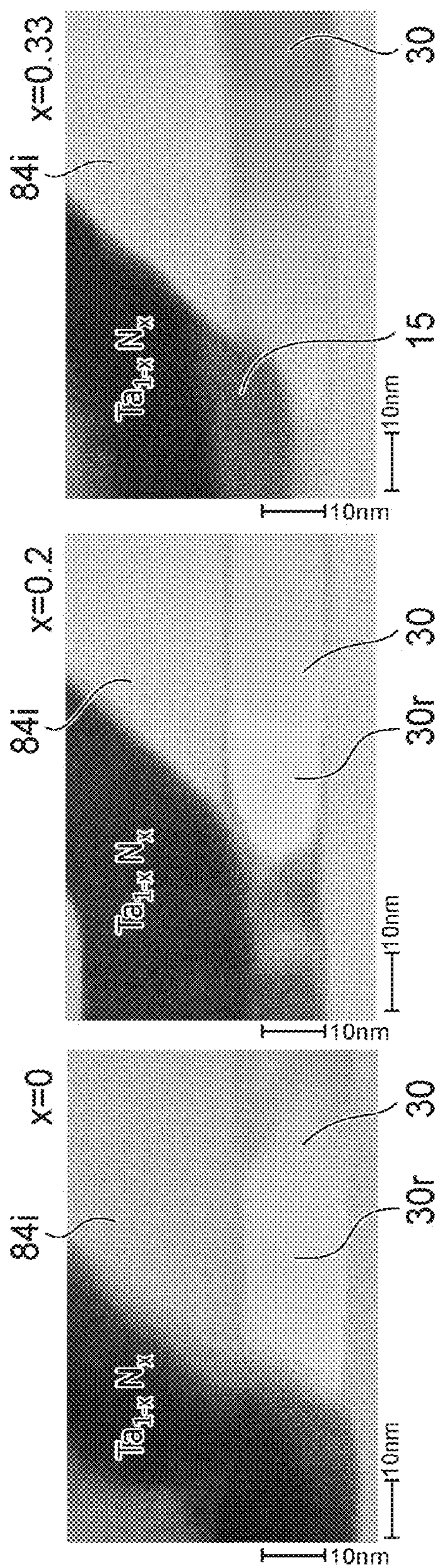
FIG. 4A to FIG. 4E are electron microscope photographs illustrating characteristics of the oxide semiconductor transistor.

These figures are cross-section transmission electron microscope (TEM) images of the sample HT for which the heat treatment (at, for example, about 400° C.) is performed. The TEM images are obtained using H-9000 NARH made by Hitachi High-Technologies Corporation; and the magnification is 2,000,000 times. The nitrogen composition (the composition ratio x of nitrogen) of the $Ta_{1-x}N_x$ layer (the $TaN_x$ layer) is different between the samples shown in these figures. In FIG. 4A, the composition ratio x is substantially 0. In FIG. 4B, the composition ratio x is about 0.2. In FIG. 4C, the composition ratio x is about 0.33. In FIG. 4D, the composition ratio x is about 0.49. In FIG. 4E, the composition ratio x is about 0.55.

It can be seen from FIG. 4A that a sparse region 30*r* occurs in the semiconductor layer 30 in the sample including the Ta layer in which the composition ratio x is substantially 0. A sparse region 30*r* occurs in the semiconductor layer 30 in the sample shown in FIG. 4B as well.

It can be seen from FIG. 4C and FIG. 4D that a reaction layer 15 occurs in the $TaN_x$ layer when the composition ratio x is about 0.33 and when the composition ratio x is about 0.49. It is considered that the reaction layer 15 is, for example, an oxide of Ta. In the example shown in FIG. 4C, the thickness of the reaction layer 15 is about 10 nm. In the example shown in FIG. 4D, the thickness of the reaction layer 15 is about 5 nm.

It can be seen from FIG. 4E that the reaction layer 15 is not observed in the $TaN_x$ layer when the composition ratio x is about 0.55. Thus, it is considered that the formation of the new layer (e.g., the reaction layer 15) recited above is suppressed when the nitrogen composition ratio x of the $Ta_{1-x}N_x$ layer is high, i.e., about 0.55. Thus, the fluctuation of the characteristics in the heat treatment at a high temperature can be suppressed by setting the nitrogen composition ratio x to be high, i.e., about 0.55.

In the embodiment, the high nitrogen composition region is disposed between the semiconductor layer 30 and the low nitrogen composition region. Thereby, the formation of the new layer (e.g., the reaction layer) recited above can be suppressed. A semiconductor device having stable characteristics can be provided.

Figure 5:
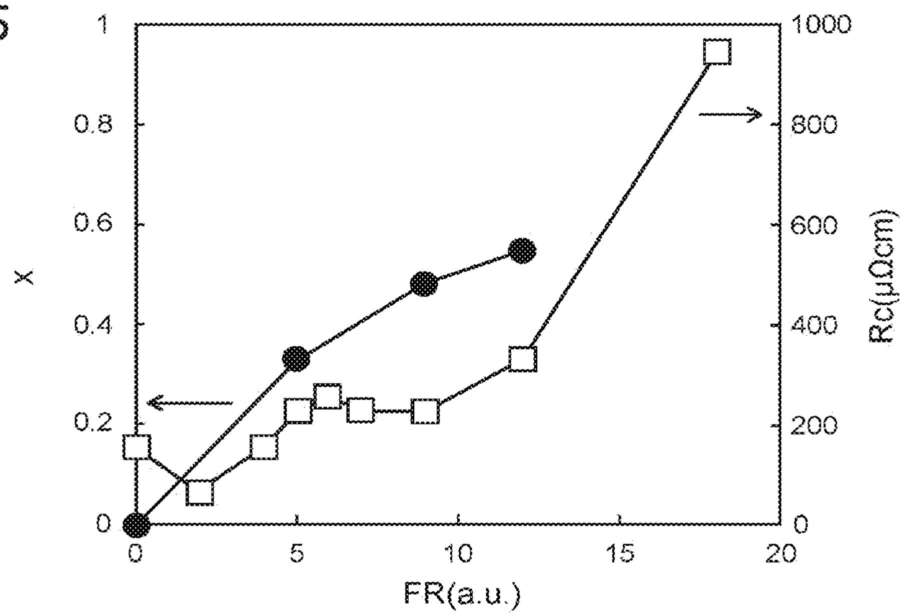
FIG. 5 is a graph of characteristics of tantalum nitride.

FIG. 5 is a graph of characteristics of tantalum nitride.

FIG. 5 illustrates the characteristics of the $Ta_{1-x}N_x$ layer. The horizontal axis of FIG. 5 is a flow rate FR of $N_2$ gas when forming the $Ta_{1-x}N_x$ layer. The vertical axis on the left side of FIG. 5 is the nitrogen composition ratio x of the $Ta_{1-x}N_x$ layer that is formed. The vertical axis on the right side of FIG. 5 is a resistivity Rc (μΩcm) of the $Ta_{1-x}N_x$ layer that is formed.

It can be seen from FIG. 5 that the nitrogen composition ratio x increases as the flow rate FR increases. Thus, for example, the nitrogen composition ratio x of the $Ta_{1-x}N_x$ layer can be modified by changing the flow rate FR. For example, the flow rate FR of the $N_2$ gas when forming the high nitrogen composition region is higher than the flow rate FR of the $N_2$ gas when forming the low nitrogen composition region. For example, the high nitrogen composition region can be formed by forming the first $Ta_{1-x}N_x$ layer using a high flow rate FR of the $N_2$ gas. The low nitrogen composition region can be formed by forming a second $Ta_{1-x}N_x$ layer using a low flow rate FR of the $N_2$ gas.

It can be seen from FIG. 5 that the resistivity Rc increases as the flow rate FR increases. For example, the resistivity Rc in the high nitrogen composition region is higher than the resistivity Rc in the low nitrogen composition region. The resistivity Rc becomes high in the case where the entire $Ta_{1-x}N_x$ layer is the high nitrogen composition region.

Conversely, in the embodiment, the stacked structure of the high nitrogen composition region and the low nitrogen composition region is used. Thereby, stable characteristics having high heat resistance are obtained due to the high nitrogen composition region; and a low resistivity Rc is obtained due to the low nitrogen composition region.

According to analysis by the inventor of the application, the $Ta_{1-x}N_x$ layer includes an amorphous region when the nitrogen composition ratio x of the $Ta_{1-x}N_x$ layer is about 0.33. On the other hand, the $Ta_{1-x}N_x$ layer has a fcc-TaN structure when the nitrogen composition ratio x of the $Ta_{1-x}N_x$ layer is about 0.5 or more. In the embodiment, a stacked structure of a $Ta_{1-x}N_x$ layer including an amorphous region and a $Ta_{1-x}N_x$ layer including a crystal (including microcrystal) portion is used.

Thus, at least a portion of the first low nitrogen composition region 10*l* is amorphous. Similarly, at least a portion of the second low nitrogen composition region 20*l* is amorphous. For example, the entire first low nitrogen composition region 10*l* may be amorphous. For example, the entire second low nitrogen composition region 20*l* may be amorphous.

On the other hand, at least a portion of the first high nitrogen composition region 10*h* has a fcc-TaN structure. Similarly, at least a portion of the second high nitrogen composition region 20*h* has a fcc-TaN structure. For example, the first high nitrogen composition region 10*h* includes a microcrystal portion. The second high nitrogen composition region 20*h* includes a microcrystal portion. For example, the entire first high nitrogen composition region 10*h* may have a fcc-TaN structure. For example, the entire second high nitrogen composition region 20*h* may have a fcc-TaN structure.

For example, the nitrogen composition ratio x1 is not less than 0.2 and not more than 0.49; and the nitrogen composition ratio x2 is not less than 0.54 and not more than 0.59. Similarly, for example, the nitrogen composition ratio x3 is not less than 0.2 and not more than 0.49; and the nitrogen composition ratio x4 is not less than 0.54 and not more than 0.59.

For example, in a semiconductor device such as LSI, the performance is improved by reducing the size of the element. The physical limits of reducing such a semiconductor device are being reached. As a method for improving the performance of the entire semiconductor device, a configuration may be considered in which transistors are formed in the circuit layer, and transistors are formed inside the interconnect layer on the circuit layer. In such a case, if the oxide semiconductor transistors are formed inside an interconnect layer of copper, the characteristics of the oxide semiconductor transistor degrade easily due to the heat treatment.

In the embodiment, the tantalum nitride layer that is included in the source/drain electrodes has a stacked structure. The nitrogen composition ratio of the layer contacting the oxide semiconductor is set to be high. Thereby, the fluctuation of the characteristics can be suppressed. Also, a low resistivity is obtained due to the layer having the low nitrogen composition ratio. The diffusion of copper can be suppressed by the $Ta_{1-x}N_x$ layer. Further, the heat resistance of the oxide semiconductor transistor can be improved.

For example, the tantalum-containing region (e.g., the Ta layer) improves the adhesion of the conductive layer (the layer including copper) provided on the tantalum-containing region (e.g., the Ta layer). The Ta layer is crystalline and includes, for example, microcrystals and crystal grain boundaries. Therefore, the copper of the conductive layer diffuses easily toward the semiconductor layer 30 via the grain boundaries.

In the embodiment, the low nitrogen composition region (e.g., the $Ta_{1-x1}N_{x1}$ layer) is provided. The low nitrogen composition region is, for example, amorphous. By providing the low nitrogen composition region, the diffusion of the copper via the crystal grain boundaries can be suppressed. By providing the high nitrogen composition region (e.g., the $Ta_{1-x2}N_{x2}$ layer), the oxidation reaction between the $Ta_{1-x}N_x$ layer and the oxygen inside the oxide semiconductor can be suppressed.

In the embodiment, the gate electrode 50 may include, for example, at least one of Cu (copper), Ta (tantalum), $Ta_{1-x}N_x$ (tantalum nitride), W (tungsten), TiN, MoTa, Al, Al—Si, Al—Si—Cu, or MoW. A stacked film of a Cu layer/Ta layer/TaN layer may be used. A stacked film of a W layer/TiN layer may be used.

$SiO_2$ is used as the gate insulating layer 40. A stacked film of a $SiO_2$ layer/SiN layer may be used. The thickness of the gate insulating layer 40 is, for example, not less than 5 nm and not more than 200 nm.

The thickness of the first tantalum-containing region 10*t* and the thickness of the second tantalum-containing region 20*t* are, for example, not less than 0.5 nm and not more than 30 nm.

The thickness of the first low nitrogen composition region 10*l* and the thickness of the second low nitrogen composition region 20*l* are, for example, not less than 0.5 nm and not more than 30 nm.

The thickness of the first high nitrogen composition region 10*h* and the thickness of the second high nitrogen composition region 20*h* are, for example, not less than 0.5 nm and not more than 30 nm.

Second Embodiment

The embodiment relates to a method for manufacturing a semiconductor device.

Figure 6:
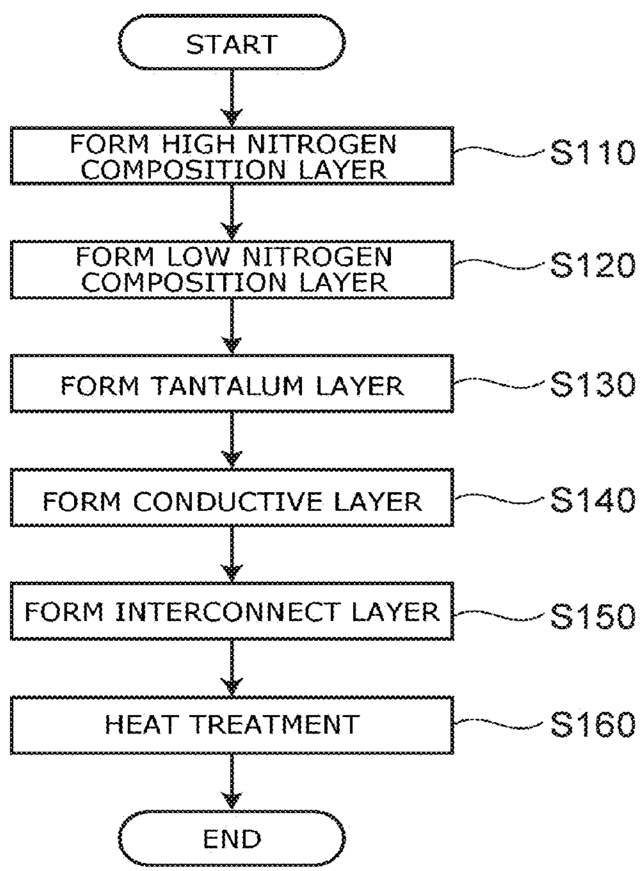
FIG. 6 is a flowchart illustrating the method for manufacturing the semiconductor device according to the second embodiment.

FIG. 6 is a flowchart illustrating the method for manufacturing the semiconductor device according to the second embodiment.

In the embodiment, the method for manufacturing the semiconductor device manufactures the semiconductor device 110 including the oxide semiconductor transistor 70. The oxide semiconductor transistor 70 includes the source electrode 10.

In the manufacturing method as shown in FIG. 6, the first high nitrogen composition region 10*h* that includes $Ta_{1-x2}N_{x2}$ ($0.5 \le x2 < 1$) is formed on a portion of the semiconductor layer 30 including an oxide semiconductor (step S110).

The first low nitrogen composition region 10*l* that includes $Ta_{1-x1}N_{x1}$ ($0 < x1 < 0.5$) is formed on the first high nitrogen composition region 10*h* (step S120).

The first tantalum-containing region 10*t* that includes tantalum is formed on the first low nitrogen composition region 10*l* (step S130).

The source conductive layer 10*c* that includes copper is formed on the first tantalum-containing region 10*t* (step S140).

Thereby, the oxide semiconductor transistor 70 that includes the source electrode 10 including the first high nitrogen composition region 10*h*, the first low nitrogen composition region 10*l*, the first tantalum-containing region 10*t*, and the source conductive layer 10*c* can be formed.

According to the embodiment, a method for manufacturing a semiconductor device having stable characteristics can be provided.

The interconnect layer 82*l* (and the interconnect 82) also may be formed (step S150).

Subsequently, heat treatment (step S160) also may be implemented. In other words, heat treatment of the source electrode 10 is performed after forming the source conductive layer 10*c*. The temperature of the heat treatment is, for example, about 400° C. or more. For example, the heat treatment of the source electrode 10 may be performed by the heat treatment of the semiconductor device 110. For example, the heat treatment of the source electrode 10 may be implemented by the heat treatment of the semiconductor device partway through the formation (the semiconductor device after the source electrode 10 is formed). For example, the damage of the copper layer included in the semiconductor device can be recovered by the heat treatment. Even when such a heat treatment is performed, the fluctuation of the characteristics of the oxide semiconductor transistor 70 can be suppressed. The steps recited above may be interchanged within the extent of technical feasibility.

In the manufacturing method according to the embodiment, the semiconductor layer 30 also may be formed on the circuit layer 81 including the semiconductor circuit 81*c*.

FIG. 7A to FIG. 7F are schematic cross-sectional views in order of the processes, illustrating the method for manufacturing the semiconductor device according to the second embodiment.

Figure 7A:
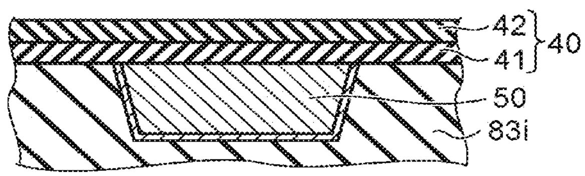
FIG. 7A to FIG. 7F are schematic cross-sectional views in order of the processes, illustrating the method for manufacturing the semiconductor device according to the second embodiment.

As shown in FIG. 7A, the gate electrode 50 is formed on a portion of the insulating layer 83*i*. For example, a tungsten film or a copper film is used as the gate electrode 50.

A SiN film that is used to form the first gate insulating film 41 is formed on the gate electrode 50. The thickness of the SiN film is less than 100 nm. For example, the first gate insulating film 41 is used to form the capping layer of the gate electrode 50. A $SiO_2$ film that is used to form the second gate insulating film 42 is formed on the first gate insulating film 41. The thickness of the $SiO_2$ film is, for example, less than 100 nm.

Figure 7B:
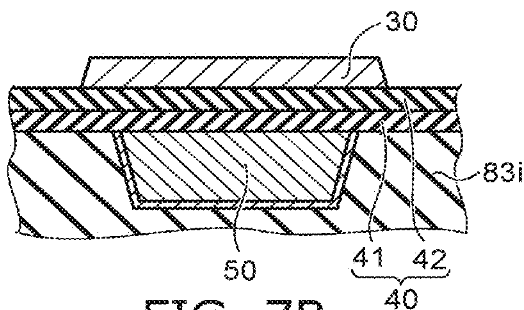

As shown in FIG. 7B, the semiconductor layer 30 is formed on the gate insulating layer 40. For example, the semiconductor layer 30 is formed by forming an oxide semiconductor film and by patterning the oxide semiconductor film. The thickness of the semiconductor layer 30 is, for example, 5 nm or more.

Figure 7E:
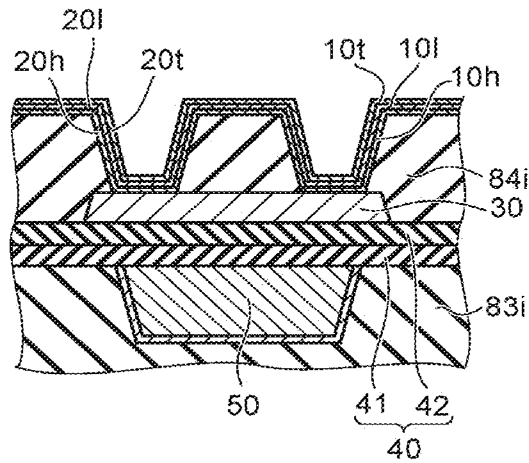
Figure 7C:
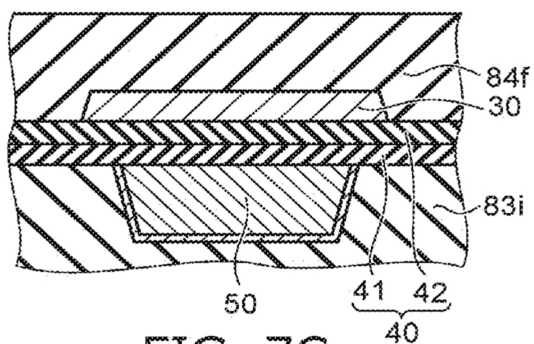

As shown in FIG. 7C, an insulating film 84*f* that is used to form the insulating layer 84*i* is formed. For example, the insulating film 84*f* includes at least one of $SiO_2$, SiOC, SiOF, or SiCN.

Figure 7F:
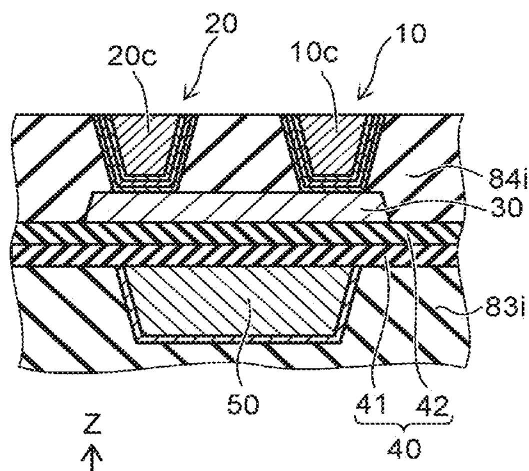
Figure 7D:
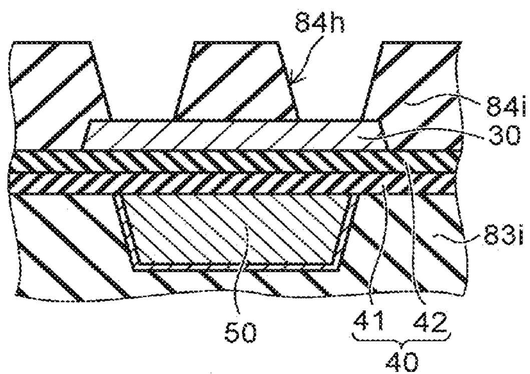

As shown in FIG. 7D, openings 84*h* are made in the insulating film 84*f*. Thereby, the insulating layer 84*i* is formed.

As shown in FIG. 7E, a film that includes $Ta_{1-x2}N_{x2}$ ($0.5 \leq x2 < 1$), a film that includes $Ta_{1-x1}N_{x1}$ ($0 < x1 < 0.5$), and a film that includes tantalum are formed in this order on the inner sides of the openings 84*h* and on the insulating layer 84*i*. For example, these films may be formed by sputtering using different targets. Or, these films may be formed by sputtering by changing the flow rate of the reactant gas ($N_2$). For example, to form the film including $Ta_{1-x2}N_{x2}$ ($0.5 \leq x2 < 1$), a gas including Ar and $N_2$ is used; and the flow rate of $N_2$ is set to be high. To form the film including $Ta_{1-x1}N_{x1}$ ($0 < x1 < 0.5$), a gas including Ar and $N_2$ is used; and the flow rate of $N_2$ is set to be low. A gas including Ar is used to form the film including tantalum. For example, the film of $Ta_{1-x1}N_{x1}$ and the film of $Ta_{1-x2}N_{x2}$ may be formed by chemical vapor deposition (CVD), atomic layer deposition (ALD), etc. The methods for forming these films are arbitrary.

As shown in FIG. 7F, a copper layer is filled into the remaining space of the openings 84*h*. For example, a seed layer of copper is formed; and subsequently, a copper layer is formed on the seed layer by, for example, plating. Subsequently, the excessive copper layer, tantalum layer, tantalum layer, and tantalum nitride layer that are formed on the insulating layer 84*i* are removed.

Thereby, the source electrode 10 and the drain electrode 20 are formed. Subsequently, for example, the interconnect layer 82*l* is formed; and heat treatment is performed.

In the embodiment, at least a portion of the material included in the interconnect layer 82*l* may be included in the gate electrode 50. For example, at least a portion of the material included in the interconnect 82 may be included in the gate electrode 50. For example, at least a portion of the material included in the circuit layer 81 may be included in the gate electrode 50. For example, at least a portion of the material included in the semiconductor circuit 81*c* may be included in the gate electrode 50.

According to the embodiments, a semiconductor device and a method for manufacturing the semiconductor device that have stable characteristics are provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components such as semiconductor layers, source electrodes, drain electrodes, gate electrodes, gate insulating layers, circuit layers, and interconnections, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising an oxide semiconductor transistor,
- the oxide semiconductor transistor including:
  - a semiconductor layer including an oxide semiconductor, the semiconductor layer including a source region; and
  - a source electrode including
    - a source conductive layer including copper,
    - a first tantalum-containing region provided between the source conductive layer and the source region, the first tantalum-containing region including tantalum,
    - a first low nitrogen composition region provided between the first tantalum-containing region and the source region, the first low nitrogen composition region including $Ta_{1-x1}N_{x1}$ ($0 < x1 < 0.5$), and
    - a first high nitrogen composition region provided between the first low nitrogen composition region and the source region, the first high nitrogen composition region including $Ta_{1-x2}N_{x2}$ ($0.5 \leq x2 < 1$).

2. The device according to claim 1, wherein at least a portion of the first low nitrogen composition region is amorphous.

3. The device according to claim 1, wherein at least a portion of the first high nitrogen composition region has a fcc-TaN structure.

4. The device according to claim 1, wherein
- x1 is not less than 0.2 and not more than 0.49, and
- x2 is not less than 0.54 and not more than 0.59.

5. The device according to claim 1, wherein
- the oxide semiconductor transistor further includes a drain electrode,
- the semiconductor layer further includes a drain region, and
- the drain electrode includes:
  - a drain conductive layer including copper;
  - a second tantalum-containing region provided between the drain conductive layer and the drain region, the second tantalum-containing region including tantalum;
  - a second low nitrogen composition region provided between the second tantalum-containing region and the drain region, the second low nitrogen composition region including $Ta_{1-x3}N_{x3}$ ($0 < x3 < 0.5$); and
  - a second high nitrogen composition region provided between the second low nitrogen composition region and the drain region, the second high nitrogen composition region including $Ta_{1-x4}N_{x4}$ ($0.5 \leq x4 < 1$).

6. The device according to claim 5, wherein the x3 is the same as the x1.

7. The device according to claim 5, wherein the x4 is the same as the x2.

8. The device according to claim 5, wherein the oxide semiconductor transistor further includes:

a gate electrode; and a gate insulating film, the semiconductor layer further includes a gate region provided between the source region and the drain region, and the gate insulating film is provided between the gate electrode and the gate region.

9. The device according to claim 8, wherein the gate insulating film includes:

a first gate insulating film including SiN; and a second gate insulating film provided between the first gate insulating film and the semiconductor layer, the second gate insulating film including $SiO_2$.

10. The device according to claim 8, wherein the gate electrode includes at least one of copper, tantalum, tantalum nitride, tungsten, TiN, MoTa, Al, Al—Si, Al—Si—Cu, or MoW.

11. The device according to claim 1, wherein the first high nitrogen composition region includes a microcrystal portion.

12. The device according to claim 1, wherein the semiconductor layer includes an oxide of at least one of In, Ga, or Zn.

13. The device according to claim 1, wherein the source electrode has at least one of a thickness of the first tantalum-containing region being not less than 0.5 nm and not more than 30 nm, a thickness of the first low nitrogen composition region being not less than 0.5 nm and not more than 30 nm, or a thickness of the first high nitrogen composition region being not less than 0.5 nm and not more than 30 nm.

14. The device according to claim 1, further comprising a circuit layer including a semiconductor circuit, the oxide semiconductor transistor being provided on the circuit layer.

15. The device according to claim 14, further comprising an interconnect electrically connected to the semiconductor circuit, a first direction intersecting a second direction, the first direction connecting the interconnect and the oxide semiconductor transistor, the second direction connecting the circuit layer and the oxide semiconductor transistor.

16. A method for manufacturing a semiconductor device, the device including an oxide semiconductor transistor including a source electrode, the method comprising:

forming a first high nitrogen composition region on a portion of a semiconductor layer including an oxide semiconductor, the first high nitrogen composition region including $Ta_{1-x2}N_{x2}$ ($0.5 \leq x2 < 1$);

forming a first low nitrogen composition region on the first high nitrogen composition region, the first low nitrogen composition region including $Ta_{1-x1}N_{x1}$ ($0 < x1 < 0.5$);

forming a first tantalum-containing region on the first low nitrogen composition region, the first tantalum-containing region including tantalum; and forming a source conductive layer on the first tantalum-containing region, the source conductive layer including copper, the source electrode including the first high nitrogen composition region, the first low nitrogen composition region, the first tantalum-containing region, and the source conductive layer.

17. The method according to claim 16, further comprising implementing heat treatment of the source electrode at 400° C. or more after the forming of the source conductive layer.

18. The method according to claim 16, further comprising forming the semiconductor layer on a circuit layer including a semiconductor circuit.

* * * * *